United States Patent [19]

Drobny

[11] Patent Number: 4,622,736
[45] Date of Patent: Nov. 18, 1986

[54] SCHOTTKY BARRIER DIODES

[75] Inventor: Vladimir F. Drobny, Beaverton, Oreg.

[73] Assignee: Tektronix, Inc., Beaverton, Oreg.

[21] Appl. No.: 575,235

[22] Filed: Jan. 30, 1984

[51] Int. Cl.$^4$ .................. H01L 29/48; H01L 29/56
[52] U.S. Cl. .................................... 29/571; 29/578; 29/589; 357/15; 357/67; 427/84; 148/1.5; 148/DIG. 19; 148/DIG. 139; 148/DIG. 147
[58] Field of Search .............. 29/571, 589, 590, 591, 29/578; 148/1.5, DIG. 19, DIG. 139, DIG. 147; 357/15, 67; 427/84

[56] References Cited

U.S. PATENT DOCUMENTS

| | | | |
|---|---|---|---|
| 3,560,809 | 2/1971 | Terakado | 148/DIG. 139 |
| 3,891,479 | 6/1975 | Zwernemann | 427/84 X |
| 4,062,103 | 12/1977 | Yamagishi | 427/84 X |
| 4,310,362 | 1/1982 | Roche et al. | 427/84 X |
| 4,395,813 | 8/1983 | Ruth et al. | 29/576 B |

FOREIGN PATENT DOCUMENTS

| | | | |
|---|---|---|---|
| 0049277 | 3/1982 | Japan | 427/84 |
| 0107685 | 6/1983 | Japan | 427/84 |

*Primary Examiner*—Brian E. Hearn
*Assistant Examiner*—David A. Hey
*Attorney, Agent, or Firm*—William S. Lovell; John Winkelman; John Smith-Hill

[57] ABSTRACT

A Schottky barrier diode is made from a substrate of semiconductor material by forming, on a major surface of the wafer, a layer of dielectric material defining a restricted opening through which the semiconductor material is exposed. A metal which forms with the semiconductor material a single phase compound which is inherently stable at temperatures up to 600 deg. C. is deposited into the opening, into contact with the exposed semiconductor material. By heating the substrate and the metal deposited thereon, the metal reacts with the semiconductor material to form a body of the single phase compound. A layer of refractory metal which reacts with the dielectric material is deposited over the dielectric material and the body of single phase compound.

4 Claims, 8 Drawing Figures

SCHOTTKY BARRIER DIODES

This invention relates to a method of manufacturing a Schottky barrier diode, and to a Schottky barrier diode structure. The invention may be used to produce a nearly ideal oxide-isolated, unguarded, integrated circuit Schottky barrier diode that is stable at temperatures up to 600 deg. C.

BACKGROUND OF THE INVENTION

Conventional oxide-isolated, unguarded Schottky barrier diodes fabricated on a silicon substrate include a body of a silicide of a near-noble metal (palladium, platinum or nickel) in intimate contact with the substrate. Diode operation relies on the potential barrier established at the interface between the substrate and the silicide body. By way of example, a conventional unguarded Schottky barrier diode has the structure illustrated in FIG. 1, and comprises a wafer 2 of n-type silicon having a surface layer 4 of $SiO_2$ defining an opening in which a body 6 of $Pd_2Si$ is disposed. Layer 4 and the body 6 are covered by a layer 8 of refractory diffusion barrier metal such as TiW.

It has been found that diodes of this form have very inconsistent properties, varying widely from device to device on the same wafer. Typically, the diode quality factor n varies between 1.1 and 3 (one being ideal), depending on the device size, processing history and geometrical profile. The forward voltage characteristics of the diode also vary widely. Accordingly, good matching of two or more diodes is very difficult to obtain. In addition, reverse characteristics of the conventional diodes (breakdown voltage and current leakage) are far from ideal. Device properties are further degraded by treatment at elevated temperatures (400 deg. C.).

It is believed that a primary reason for the poor properties of the conventional unguarded Schottky barrier diode shown in FIG. 1 is that a parasitic Ti silicide/Si oxide/silicon MIS diode is formed around the perimeter of the body 6. Due to the large differences in heats of formation for titanium silicide and titanium oxide as compared with silicon dioxide, the titanium in the layer 8 extracts silicon from the surface region of the layer 4, so that the silicon dioxide in the surface region, and particularly around the perimeter of the body 6, is reduced and quantum-mechanical tunneling occurs in the resulting region. This perimeter region is typically 50 to 500 A wide, depending on the profile of the cut formed in the layer 4 in order to expose the wafer 2. This effect is aggravated by the fact that titanium is a low work function metal, and accordingly causes an accumulation of electrons at the surface of the n-type silicon. Accordingly, the parasitic MIS diode has a very low barrier and is leaky.

SUMMARY OF THE INVENTION

According to a first aspect of the present invention there is provided a method of manufacturing a Schottky barrier diode utilizing a substrate of semiconductor material, comprising forming a layer of dielectric material on a major surface of said substrate, said layer defining a restricted opening through which the substrate is exposed, forming within said opening at said major surface a body of a single phase compound formed of said semiconductor material and a metal, which compound is inherently stable at temperatures up to 600 deg. C., and depositing a layer of a refractory metal over the dielectric material and said body.

According to a second aspect of the present invention there is provided a Schottky barrier diode comprising a substrate of semiconductor material having a major surface, a layer of dielectric material on said major surface of the wafer and defining a restricted opening, and a body of a single phase compound formed of said semiconductor material and a metal, which compound is inherently stable at temperatures up to 600 deg. C., said body being in intimate physical contact with the semiconductor material at said major surface of the substrate and within said restricted opening, and the diode also comprising a layer of a refractory metal over the dielectric material and said body of single phase compound.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
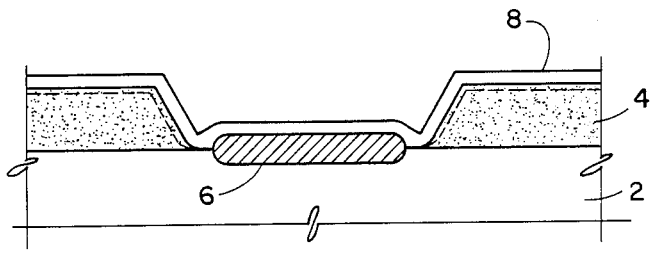
FIG. 1 is an enlarged sectional view of a conventional Schottky barrier diode.
Figure 2:
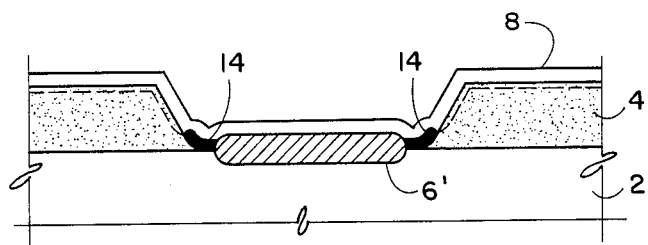
FIG. 2 is a similar view of an oxide-isolated, unguarded Schottky barrier diode embodying the present invention.
Figure 3:
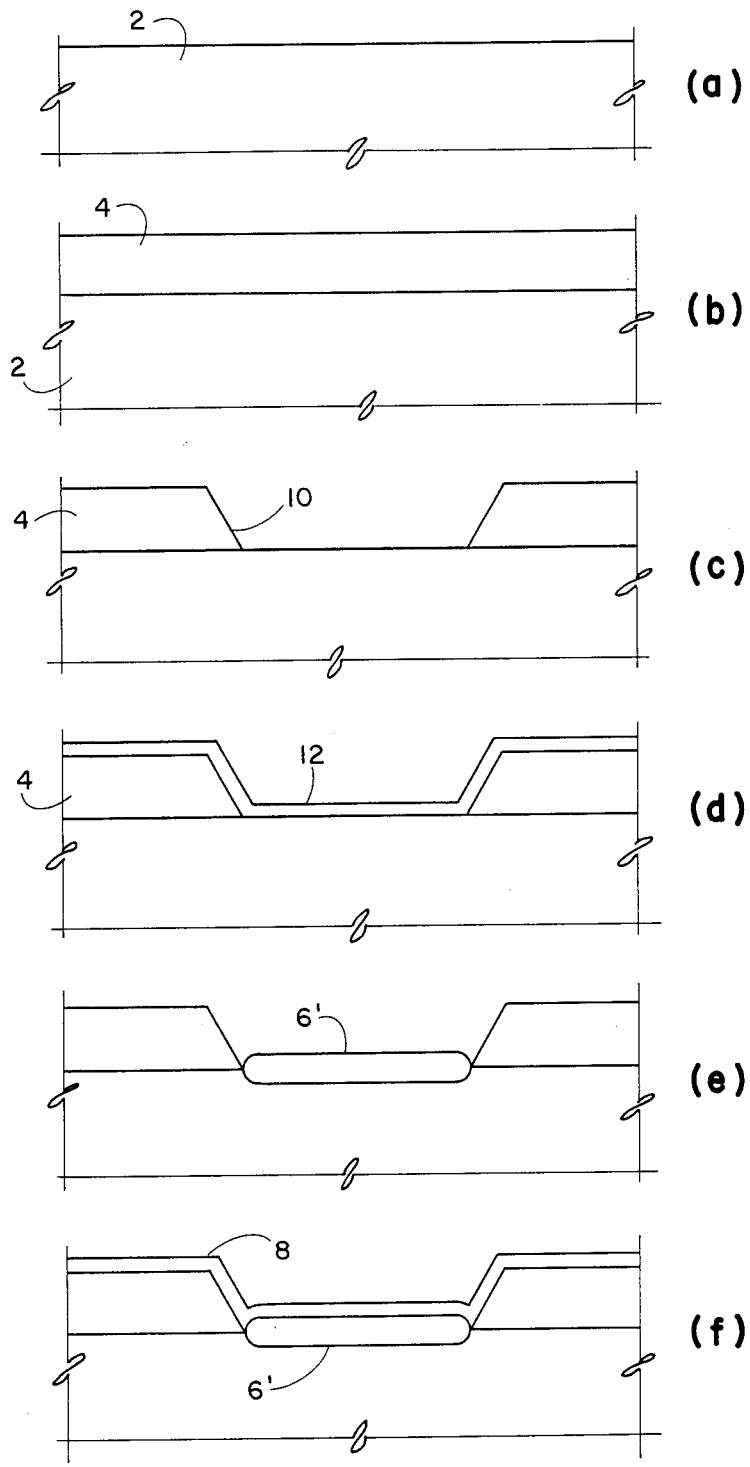
FIGS. 3a–e illustrates the steps for fabricating the FIG. 2 diode.

The Schottky barrier diode illustrated in FIG. 2 is similar to that illustrated in FIG. 1, except that the body 6' is made of vanadium silicide instead of near-noble metal silicide such as palladium silicide. The diode shown in FIG. 2 is fabricated from a wafer 2 of n-type silicon. A layer 4 of $SiO_2$ approximately 800 nm thick is formed on the wafer by thermal oxidation. A window 10 approximately 13 μm in diameter is formed in the layer 4, and a layer 12 of V about 10 nm thick is vacuum deposited over the layer 4 and into the window 10. The wafer is then heated at 600 deg. C. for 15 minutes in a forming gas comprising a mixture of hydrogen and an inert gas such as helium. The body 6' of $VSi_2$ is formed where the V contacts the silicon previously exposed through the window 10. Unreacted V is chemically removed, and the layer 8 of TiW is deposited over the layer 4 and the body 6'. Sputtered Au is used to provide a contact on the opposite face (not shown) of the wafer. This process flow, which is depicted in FIG. 3, is essentially the same as that which may be used to form the conventional diode shown in FIG. 1, except for the use of V instead of Pd and the temperature at which the forming operation takes place.

During the formation of the vanadium silicide, silicon diffuses from the wafer into the vanadium layer 12 more rapidly than vanadium diffuses from the deposited layer 12 into the silicon wafer 2. Thus, a controlled outdiffusion of silicon occurs around the perimeter of the body 6', and the outdiffused silicon prevents the formation of a low barrier parasitic Ti/oxide/Si diode. Thermodynamic calculations suggest that a thin layer 14 of vanadium silicide forms on the surface of the $SiO_2$ immediately adjacent the body 6'. When the layer of TiW is deposited, the layer 14 of vanadium silicide serves as a barrier to extraction of silicon from the $SiO_2$ by the titanium, since this is not thermodynamically favorable. The vanadium silicide/oxide/n-Si MIS diode does not cause a high current leakage and large value of the diode quality factor, since the work function of the vanadium is high enough to prevent accumulation of electrons at the surface of the silicon wafer. Thus, vanadium silicide does not form a low barrier tunneling MIS diode. Vanadium is selected due to the favorable intrinsic barrier height (0.645 eV) of its silicide, the inherent stability of its silicide at elevated temperatures (up to 600 deg. C.) and formation of a singular vanadium silicide phase when in contact with elemental silicon.

It has been found that unguarded diodes fabricated in accordance with the invention have forward I-V characteristics that are virtually indistinguishable from those of their guarded counterparts, which are more difficult to make, and are very repeatable. Accordingly, it is easy to make matched pairs or groups of diodes on a single I.C. substrate, and the variation of properties from chip to chip, wafer to wafer and run to run are minimal. The reverse characteristics of the diode are favorable. A diode quality factor n of less than 1.06 can readily be achieved for the unguarded devices.

It will be appreciated by those skilled in the art that the invention is not restricted to the particular diode structure and fabrication method which have been described, since variations may be made therein without departing from the scope of the invention as defined in the appended claims, and equivalents thereof. Thus, other metals than vanadium may be used, provided they have the required properties in terms of barrier height, (having a range from about 0.6, eV to about 0.8 eV) controlled outdiffusion of silicon and stability at elevated temperatures. For example, thermodynamic calculations suggest that tungsten, the silicide of which has a barrier height of about 0.67 eV, may be used instead of vanadium.

I claim:

1. A method of manufacturing a Schottky barrier diode utilizing a substrate of semiconductor material, comprising forming a layer of dielectric material on a major surface of said substrate, said layer defining a restricted opening through which the substrate is exposed, forming within said opening at said major surface a body of a single phase compound of semiconductor material and a first metal, which compound is intrinsically stable at temperatures up to 600 deg. C. and which first metal has an intrinsic barrier height within the range from about 0.6 eV to about 0.8 eV, and depositing a layer of a refractory metal over the dielectric material and said body.

2. A method according to claim 1, wherein said semiconductor material is silicon and said just metal is vanadium.

3. An improved method of manufacturing a Schottky barrier diode utilizing a substrate of semiconductor material, comprising forming a layer of dielectric material on a major surface of said substrate, said layer defining a restricted opening through which the substrate is exposed, forming within said opening at said major surface a body of a compound of said semiconductor material and a first metal, and depositing a layer of a refractory metal over the dielectric material and said body, and wherein the improvement resides in that said first metal is such that
   (a) combination of the semiconductor material with the first metal is favored over combination of the semiconductor material with the refractory metal;
   (b) the first metal forms a single phase compound with the semiconductor material, which compound is intrinsically stable at temperatures up to 600 deg. C.; and
   (c) the work function of the first metal is sufficiently high that it does not cause an accumulation of charge carriers at the interface between the said body and the semiconductor material.

4. A method according to claim 3, wherein the semiconductor material is silicon and the intrinsic barrier height of the silicide of the first metal is at least about 0.64 eV.

* * * * *